US010388528B2

(12) United States Patent
Chen et al.

(10) Patent No.: US 10,388,528 B2
(45) Date of Patent: Aug. 20, 2019

(54) NON-AMBIPOLAR ELECTRIC PRESSURE PLASMA UNIFORMITY CONTROL

(71) Applicant: TOKYO ELECTRON LIMITED, Tokyo (JP)

(72) Inventors: Lee Chen, Cedar Creek, TX (US); Zhiying Chen, Austin, TX (US); Jianping Zhao, Austin, TX (US); Merritt Funk, Austin, TX (US)

(73) Assignee: TOKYO ELECTRON LIMITED, Tokyo (JP)

( * ) Notice: Subject to any disclaimer, the term of this patent is extended or adjusted under 35 U.S.C. 154(b) by 397 days.

(21) Appl. No.: 15/164,312

(22) Filed: May 25, 2016

(65) Prior Publication Data
US 2016/0268136 A1    Sep. 15, 2016

Related U.S. Application Data (62) Division of application No. 14/212,438, filed on Mar. 14, 2014, now abandoned.
(Continued)

(51) Int. Cl.
*H01J 37/32* (2006.01)
*H01L 21/263* (2006.01)
*H01L 21/67* (2006.01)

(52) U.S. Cl.
CPC ...... *H01L 21/263* (2013.01); *H01J 37/32431* (2013.01); *H01J 37/32568* (2013.01); *H01J 37/32697* (2013.01); *H01L 21/67069* (2013.01)

(58) Field of Classification Search
CPC ........... H01L 21/263; H05H 2001/2431; H01J 37/063; H01J 37/32036; H01J 37/32045; H01J 37/32082; H01J 37/32174; H01J 37/32357; H01J 37/32532; H01J 37/32541; H01J 37/32568; H01J 37/32577; H01J 37/32596; H01J 37/32633; H01J 37/32697; H01J 37/32587; H01J 37/32642
See application file for complete search history.

(56) References Cited

U.S. PATENT DOCUMENTS

4,950,156 A * 8/1990 Philipossian ........... C30B 31/16
                                                      118/715
5,980,999 A   11/1999 Goto et al.
(Continued)

*Primary Examiner* — Dah-Wei D. Yuan
*Assistant Examiner* — Nga Leung V Law
(74) *Attorney, Agent, or Firm* — Rothwell, Figg, Ernst & Manbeck, P.C.

(57) ABSTRACT

This disclosure relates to a plasma processing system for controlling plasma density near the edge or perimeter of a substrate that is being processed. The plasma processing system may include a plasma chamber that can receive and process the substrate using plasma for etching the substrate, doping the substrate, or depositing a film on the substrate. This disclosure relates to a plasma processing system that may be configured to enable non-ambipolar diffusion to counter ion loss to the chamber wall. The plasma processing system may include a ring cavity coupled to the plasma processing system that is in fluid communication with plasma generated in the plasma processing system. The ring cavity may be coupled to a power source to form plasma that may diffuse ions into the plasma processing system to minimize the impact of ion loss to the chamber wall.

20 Claims, 7 Drawing Sheets

Related U.S. Application Data

(60) Provisional application No. 61/799,718, filed on Mar. 15, 2013.

(56) References Cited

U.S. PATENT DOCUMENTS

| | | | |
|---|---|---|---|
| 6,020,570 | A | 2/2000 | Taki et al. |
| 6,116,187 | A | 9/2000 | Murakami et al. |
| 6,446,572 | B1 * | 9/2002 | Brcka .................... C23C 14/32 118/723 AN |
| 8,277,561 | B2 | 10/2012 | Kim et al. |
| 2006/0066247 | A1 * | 3/2006 | Koshiishi .......... H01J 37/32018 315/111.21 |
| 2007/0023398 | A1 | 2/2007 | Kobayashi et al. |
| 2008/0180357 | A1 | 7/2008 | Kawakami et al. |
| 2008/0241420 | A1 * | 10/2008 | Dhindsa ............ H01J 37/32091 427/569 |
| 2009/0011150 | A1 | 1/2009 | Jeon et al. |
| 2009/0165713 | A1 | 7/2009 | Kim et al. |
| 2009/0236314 | A1 * | 9/2009 | Chen ................ H01J 37/32091 216/67 |
| 2010/0159120 | A1 | 6/2010 | Dzengeleski et al. |
| 2010/0252200 | A1 | 10/2010 | Marakhtanov et al. |
| 2013/0025788 | A1 | 1/2013 | Shajii et al. |
| 2013/0098551 | A1 | 4/2013 | Dorf et al. |
| 2013/0122711 | A1 | 5/2013 | Marakhtanov et al. |

\* cited by examiner

NON-AMBIPOLAR ELECTRIC PRESSURE PLASMA UNIFORMITY CONTROL

CROSS REFERENCE TO RELATED APPLICATION

The present application is a Divisional Application of and claims the benefit of priority from co-pending U.S. application Ser. No. 14/212,438, filed Mar. 14, 2014 and Provisional Application Ser. No. 61/799,718 filed Mar. 15, 2013. The entire contents of the foregoing applications are incorporated herein by reference.

FIELD OF THE INVENTION

This invention relates to semiconductor processing technology, and more particularly, to apparatus and methods for controlling plasma properties of a processing system for treating a substrate.

BACKGROUND OF THE INVENTION

Plasma uniformity control during plasma processing for treating semiconductor substrates is important to achieve patterning structures on a substrate or controlling the amount of material removed from or deposited on or into the substrate. A plasma processing system may include a large distance or gap between the plasma source and the substrate. A chamber wall of the plasma processing may be disposed between the plasma source and the substrate. As a result, ions and electrons in the plasma may be influenced by the potential difference between the plasma and the chamber wall. The ions proximate to the chamber wall may migrate towards the chamber wall instead of the substrate. The loss of ions to the chamber wall may alter the plasma density profile across the substrate that may introduce processing non-uniformities that may negatively impact semiconductor devices being built in or on the substrate. For example, a lower plasma density at the edge of the substrate may induce a lower etch or deposition rate at the edge of the substrate than at the center of the substrate. Hence, systems and methods that improve plasma density profile uniformity may be desirable.

SUMMARY OF THE INVENTION

This disclosure relates to a plasma processing system for controlling plasma density near the edge or perimeter of a substrate that is being processed. The plasma processing system may include a plasma chamber that can receive and process the substrate using plasma for etching the substrate, doping the substrate, or depositing a film on the substrate.

The plasma chamber may include one or more plasma sources that can emit electromagnetic energy to ionize gas that is delivered via a gas delivery system. The distance between the plasma and the substrate may sufficiently confine the charted particles in the plasma to enable a uniform plasma density. The charged particles may be attracted to potential sources (e.g., chamber wall) that prevent charged particles from reaching the chamber wall. The loss of the charge particles to a potential boundary or chamber wall may result in plasma density non-uniformity that leads to substrate processing non-uniformity.

One approach to minimizing charged particle (e.g., ions) loss may be to alter the boundary potential proximate to the chamber wall in a way that may diffuse ions into the plasma chamber or push ions away from the chamber wall. The boundary potential or plasma sheath proximate to the chamber wall may be altered by including a ring cavity surrounding a portion of the chamber wall and that is in fluid communication with the plasma chamber via openings between the ring cavity and the plasma chamber. The ring cavity may include an electrode along an interior surface of the ring cavity that may be coupled to one or more power sources (e.g., direct current, radio frequency, etc.). The boundary potential or plasma sheath at the chamber wall may be altered by this arrangement in way that generates a plasma sheath conditions that enable the electric pressure concept by diffusing ions into the plasma chamber. In other words, the electric pressure may be enabled by forming a potential difference proximate to the chamber wall that may alter the plasma density or plasma sheath proximate to the chamber wall, such that the plasma density across the plasma chamber may be more uniform.

In one embodiment, this electric pressure may be generated using non-ambipolar diffusion of ions from a ring cavity or chamber that is adjacent to the plasma chamber. The non-ambipolar diffusion may occur between regions of different localized plasma potential. The diffusion may include the exchange of ions and electrons between the regions, in that the first region (e.g., inside the plasma chamber) may diffuse electrons towards a second plasma region and that the second region (e.g., ring cavity) may diffuse ions towards the first plasma region in a systematic manner. The diffusion of ions and electrons in opposing directions may enable an increase in ion density in the first region in the plasma chamber. The diffusion of the ions may alter the rate of ion loss from the first plasma region to the plasma chamber wall. In this way, the plasma density exposed to the substrate may be more uniform, particularly near the edge of the substrate, such that substrate processing may be more uniform from the center to the edge of the substrate.

The ring cavity may be used alone or in conjunction with one or more additional plasma sources that may include, but are not limited to, inductive coupling sources, microwave sources, radio frequency sources, or a combination thereof.

BRIEF DESCRIPTION OF THE DRAWINGS

The accompanying drawings, which are incorporated in and constitute a part of this specification, illustrate embodiments of the invention and, together with a general description of the invention given above, and the detailed description given below, serve to explain the invention. Additionally, the left most digit(s) of a reference number identifies the drawing in which the reference number first appears.

DETAILED DESCRIPTION

The following Detailed Description refers to accompanying drawings to illustrate exemplary embodiments consistent with the present disclosure. References in the Detailed Description to "one embodiment," "an embodiment," "an exemplary embodiment," etc., indicate that the exemplary embodiment described can include a particular feature, structure, or characteristic, but every exemplary embodiment does not necessarily include the particular feature, structure, or characteristic. Moreover, such phrases are not necessarily referring to the same embodiment. Further, when a particular feature, structure, or characteristic is described in connection with an embodiment, it is within the knowledge of those skilled in the relevant art(s) to affect such feature, structure, or characteristic in connection with other exemplary embodiments whether or not explicitly described.

The exemplary embodiments described herein are provided for illustrative purposes, and are not limiting. Other embodiments are possible, and modifications can be made to exemplary embodiments within the scope of the present disclosure. Therefore, the Detailed Description is not meant to limit the present disclosure. Rather, the scope of the present disclosure is defined only in accordance with the following claims and their equivalents.

The following Detailed Description of the exemplary embodiments will so fully reveal the general nature of the present disclosure that others can, by applying knowledge of those skilled in the relevant art(s), readily modify and/or adapt for various applications such exemplary embodiments, without undue experimentation, without departing from the scope of the present disclosure. Therefore, such adaptations and modifications are intended to be within the meaning and plurality of equivalents of the exemplary embodiments based upon the teaching and guidance presented herein. It is to be understood that the phraseology or terminology herein is for the purpose of description and not limitation, such that the terminology or phraseology of the present specification is to be interpreted by those skilled in relevant art(s) in light of the teachings herein.

Figure 1:
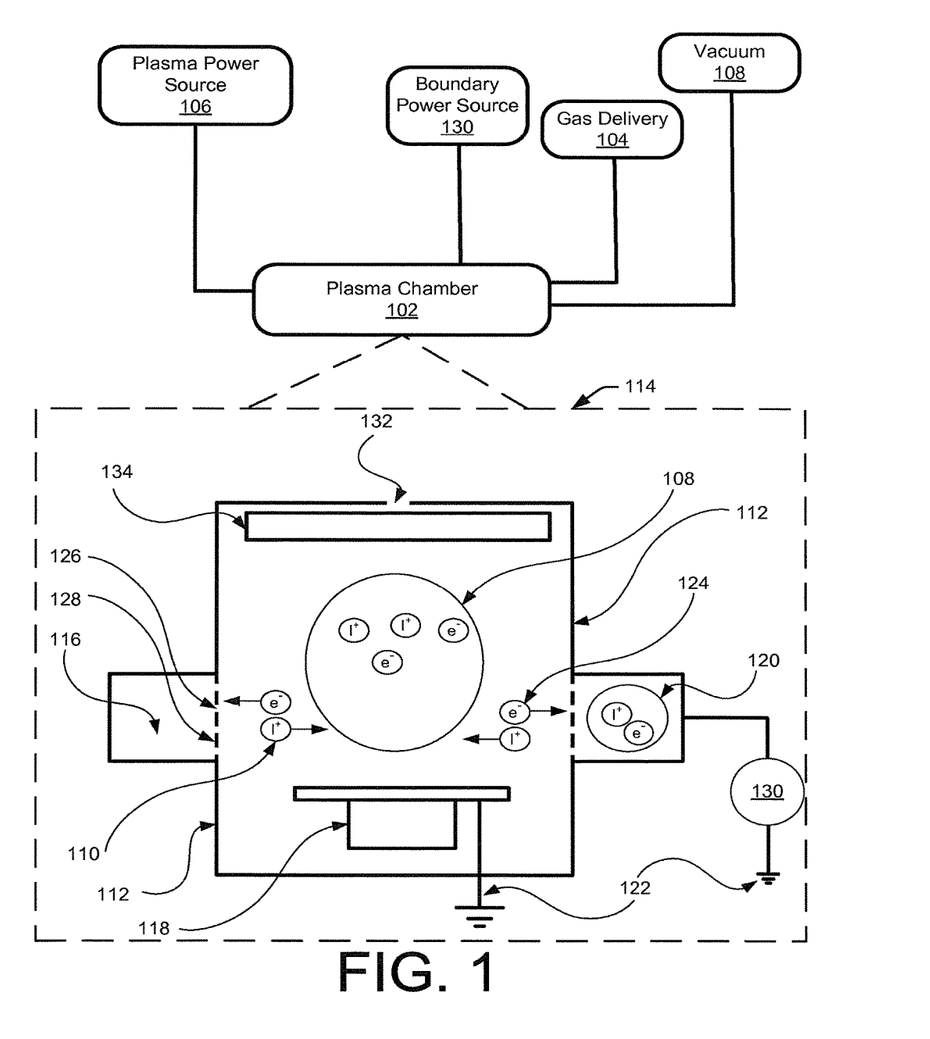
FIG. 1 is an illustration of a representative embodiment of a plasma processing system that shows a schematic cross-sectional illustration of a plasma chamber that includes a non-ambipolar plasma source.

FIG. 1 depicts a plasma processing system 100 for treating substrates using plasma (not shown) that is generated in plasma chamber 102. Plasma may be generated in the plasma chamber 102 by ionizing gas that is provided by a gas delivery system 104 and exposing the gas to electromagnetic energy provided by a plasma power source 106. A vacuum system 108 may also maintain a sub-atmospheric pressure within the plasma chamber 102 during plasma generation.

Plasma generation (e.g., first plasma region 108) may be done by applying electromagnetic energy to an electrically neutral gas to cause negatively charged electrons to be released from a gas molecule that is positively charged as a result of the lost electron. Over time, the electromagnetic energy and the increasing electron collisions within the gas may increase the density of ionized molecules within the gas, such that the ionized molecules may be influenced by potential differences within the plasma chamber 102. For example, the potential differences within the plasma chamber 102 may direct the ionize molecules towards a substrate (not shown). The ionized molecules 110 may interact with the substrate or treat the substrate in a way that may remove a portion of the substrate or may be deposited unto the substrate. In this way, patterns may be etched into the substrate or films may be deposited onto the substrate.

Plasma density across the plasma chamber 102 may impact the uniformity of the plasma treatment of the substrate. The plasma density may be ion molecule 110 density within a volume within the plasma chamber 102. Plasma processing uniformity may be impacted when the plasma density varies across the substrate such that higher plasma density at the center of the substrate may cause a higher etch rate than the etch rate at the edge of the substrate. Generally, this process non-uniformity may be the result of ion loss to the chamber wall 112, specifically for a wide gap between the plasma source 134 and the substrate holder 118. One approach to resolve the non-uniformity may be to alter or generate a sheath or boundary potential (not shown) at the chamber wall 112 that may minimize the impact ion 108 loss to the chamber wall 112. A cross sectional view 114 of the plasma chamber 102 illustrates one embodiment of this approach.

In this embodiment (e.g., view 114), the sheath or boundary potential may be altered by using a ring cavity 116 that surrounds the plasma chamber 102 and may be in fluid communication the processing region of the plasma chamber 102. The processing region may be enclosed by the chamber wall 112 or any region that may be used to treat a substrate (not shown) placed on a substrate holder 118 that may or may not be grounded 122. Although the ring cavity 116 is shown in FIG. 1 to be coupled to the chamber wall 112, the ring cavity 116 is not required to be coupled to the chamber wall 112.

The ring cavity 116 may be used to generate a second plasma region 120 that may provide ions 110 to the first plasma region 108 and may receive electrons 124, via non-ambipolar diffusion, from the first plasma region 108, as indicated by the arrows on electron 124 and ion 110. The diffusion of ions 110 and electrons 124 may be done through openings 126 between the ring cavity 116 and the chamber wall 112. The diffusion rate may be based, at least in part, on geometry of the openings 126, ring cavity barrier walls 128, and the power applied to an electrode (not shown) in the ring cavity 116. The power may be supplied by a boundary power source 130 that may include, but is not limited to, a RF power source, a DC power source, a microwave power source, or a combination thereof. In this embodiment, the plasma chamber 102 may also include a gas distribution system 132 that provides gas that may be energized by a plasma source 134 to form the first plasma region 108. In other embodiments, the first plasma region 108 may be generated by one or more plasma sources 134 that may include, but are not limited to, inductive coupling sources, microwave sources, radio frequency sources, or a combination thereof.

Figure 2:
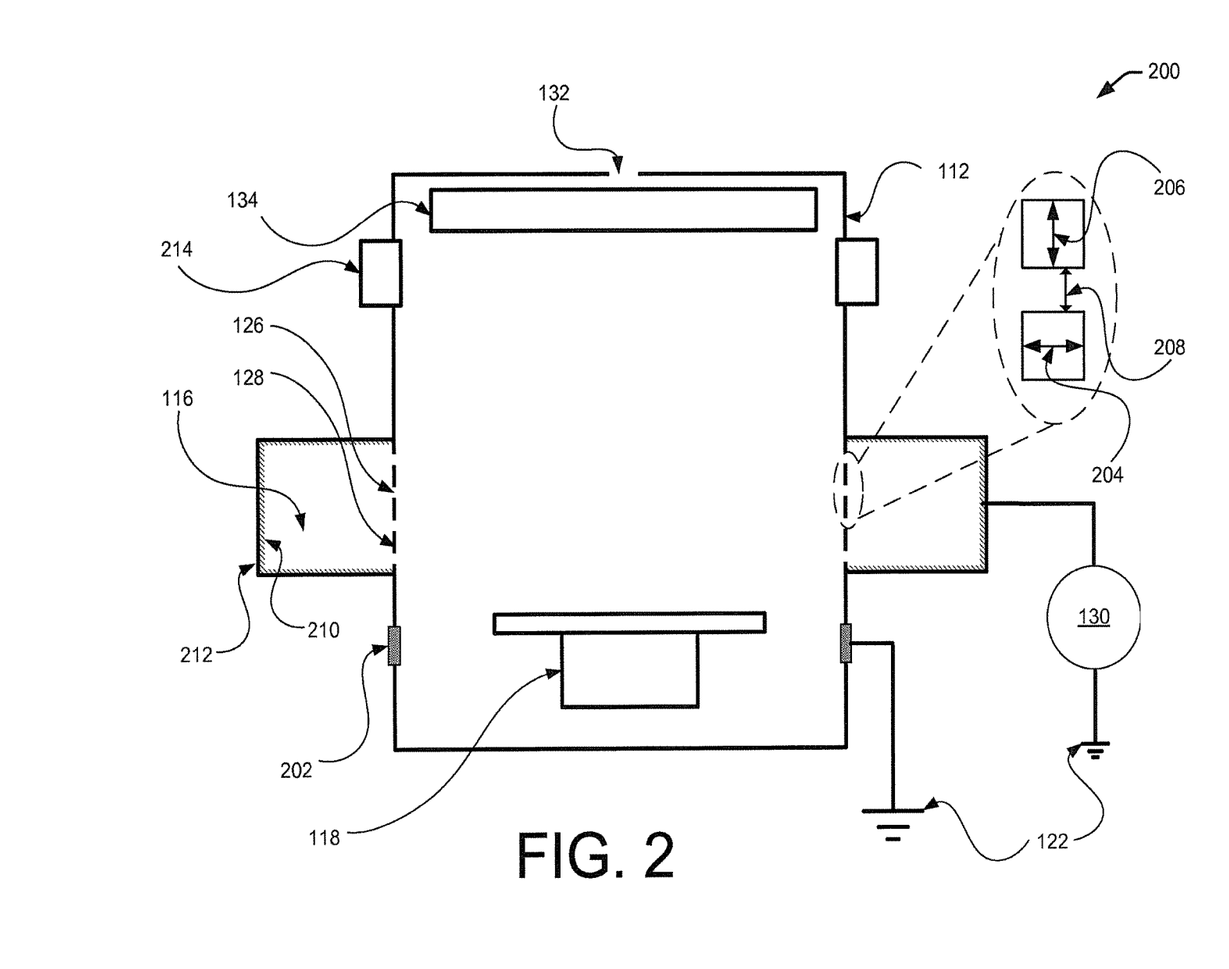
FIG. 2 is an illustration of a representative embodiment of a plasma processing system that shows a schematic cross-sectional illustration of a plasma chamber that includes a non-ambipolar plasma source and a ground ring.

FIG. 2 is a schematic cross-sectional illustration 200 of a plasma chamber 102 that includes a non-ambipolar plasma source or ring cavity 116 and a ground ring 202 disposed below or proximate to the ring cavity 116. The ground ring 202 may be used in conjunction with the ring cavity 116 to control the plasma sheath (not shown) proximate to the chamber wall 112. The ground ring 202 may be embedded in the chamber wall 112 or inside the plasma chamber 102 (see FIG. 4).

The geometry and magnitude of the plasma sheath (see FIG. 3) may be used to control the non-ambipolar diffusion rate between ring cavity and the plasma chamber 102. The non-ambipolar diffusion rate may also be controlled based, at least in part, on the geometry of the openings 126 and the ring cavity barrier walls 128. The ring cavity barrier walls 128 may vary in depth 204 and height 206 and the openings 126 may also vary in opening height 208. As the opening height 208 increases and the ring cavity barrier wall depth 204 decreases, the ion diffusion from the ring cavity 116 into the plasma chamber 102 may increase. Likewise, the ion diffusion may decrease with decreasing opening height 208 and increasing ring cavity barrier wall depth 204. Although the openings and the ring cavity barrier walls are shown to be continuous in FIG. 2, they are not required to be continuous, as will be discussed in the description of FIG. 5. The ring cavity barrier walls 128 may be made of a dielectric material, such as quartz or ceramic, that may enable potential of the ring cavity 116 to float. Hence, the ring cavity barrier walls 128 may be electrically isolated from the electrode 210. In another embodiment, the ring cavity barrier walls 128 may be made of metal that may be covered by a dielectric material such as quartz or ceramic.

The power applied to the ring cavity 116 may also impact the ion diffusion rate. The boundary power supply 130 may be coupled to an electrode 210 inside the ring cavity 116. In the FIG. 2 embodiment, the electrode 210 may be coupled to the interior wall 212 of the ring cavity 116. The electrode 210 may made of any conductive material that may be used to energize any gas within the ring cavity 116. In other embodiments, the electrode may just cover a portion of the interior wall 212 and is not required to cover the entire or majority of the interior wall 212, as shown in FIG. 2. The electrode 210 may also be covered by a dielectric material (not shown), such as, but not limited to, quartz and/or ceramic, to prevent etching or sputtering of the electrode 210.

In this embodiment, a secondary plasma source 214 may also be used in conjunction with the plasma source 134 to generate the first plasma region 108. The secondary plasma source 214 may be incorporated into the chamber wall 112 or may be located away from the plasma chamber 102 and generate plasma remotely that may be provided to the plasma chamber 102. In the FIG. 2 embodiment, the secondary plasma source 214 may be disposed between the substrate holder 118 and the plasma source 134. This configuration may be used to control plasma density across the substrate holder 118 in conjunction with the ring cavity 116. The secondary plasma source 214 may include, but are not limited to, inductive coupling sources, microwave sources, radio frequency sources, or a combination thereof.

Figure 3:
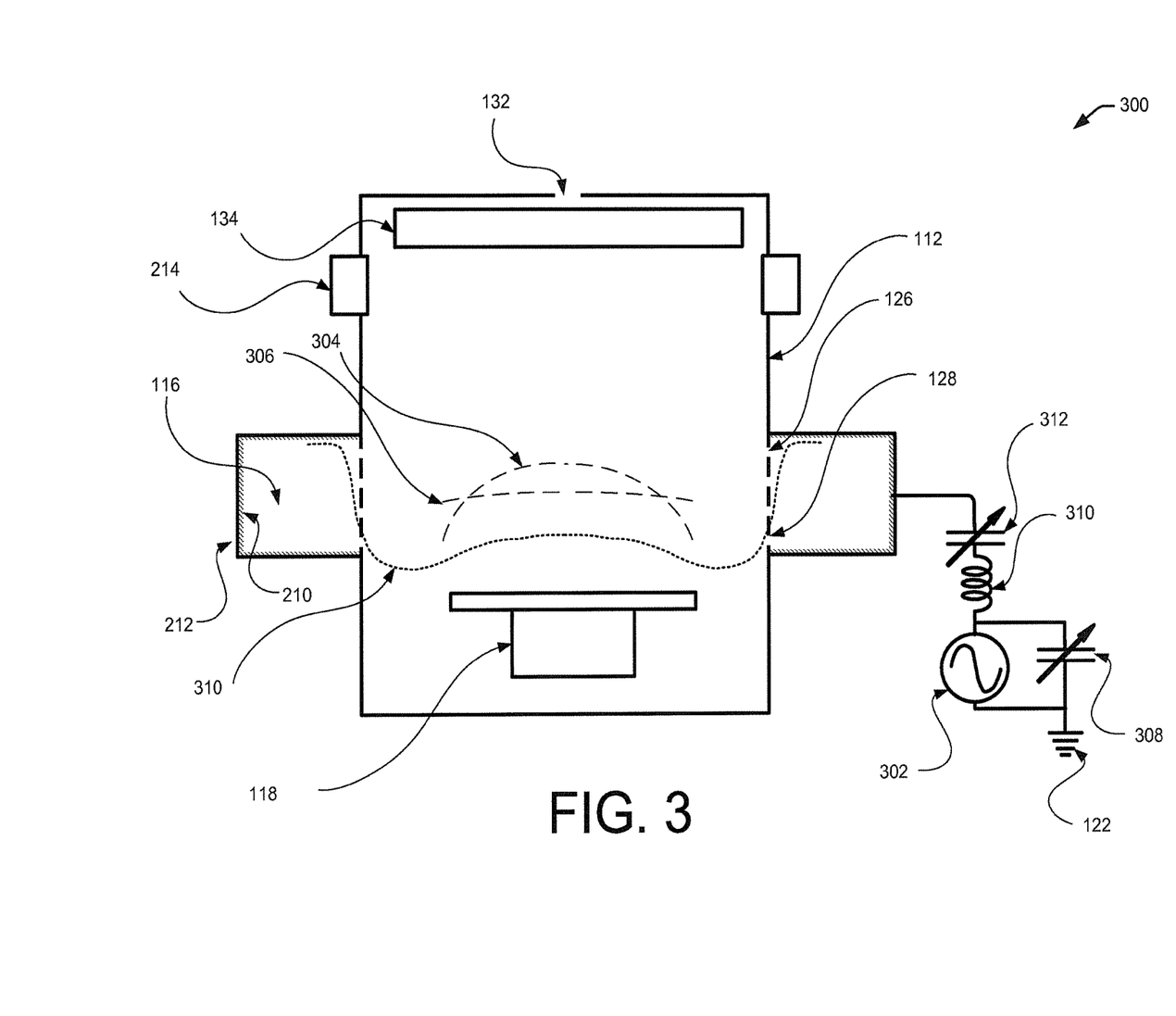
FIG. 3 is an illustration of a representative embodiment of a plasma processing system that shows a schematic cross-sectional illustration of a plasma chamber that includes a non-ambipolar plasma source coupled to radio frequency (RF) or alternating current power source.

FIG. 3 is an illustration 300 of a representative embodiment of a plasma processing system that shows a schematic cross-sectional illustration of a plasma chamber 102 that includes a non-ambipolar plasma source (e.g., ring cavity 116) coupled to radio frequency (RF) or alternating current (AC) power source 302. The illustration 300 also includes representative plasma density profiles that may be generated by the first plasma region 108 and a combination of the first plasma region 108 and the second plasma region 120. The first plasma density profile 304 indicates that the plasma density is higher at the center of the substrate holder 118 than at the edge. The first plasma density profile 304 may be representative of using the plasma source 134 and/or the secondary plasma source 214 without using the ring cavity 116. In contrast, the NEP plasma density profile 306 may be generated by the combination of the effects of the first plasma region 108 (e.g., plasma source 134 and/or secondary plasma source 214) and the second plasma region 120 (e.g., ring cavity 116). As shown in FIG. 3, the NEP plasma density profile 306 is more uniform across the plasma chamber 102. The uniformity may be driven by the ions 110 that are provided from the ring cavity 116 to the plasma chamber 102 towards the substrate holder 118. The ions 110 provided from the second plasma region 120 may counteract the loss of ions 110 from the first plasma region 108 to the chamber wall 112. The NEP plasma density profile 306 may be achieved by enabling the plasma potential distribution 310 or wall double layer (W-DL) across the plasma chamber 102. The W-DL may be adjusted to achieve an NEP plasma density profile 306 that may be flatter than the first plasma density profile 304. The W-DL may be adjusted up or down (e.g., vertically) or moved expanded or contracted in a substantially horizontal manner to achieve a relatively flatter plasma density profile under a variety of process conditions. The W-DL may result in an increase of plasma density near the edge of the substrate due to the diffusion of ions 110 from the ring cavity 116. Generally, the W-DL may be implemented in various ways using any of the embodiments, or variations of those embodiments, disclosed in this application to achieve a uniform plasma density profile (e.g., NEP plasma density profile 306 vs. first plasma density profile 304) across the plasma chamber 102, or at least the substrate holder 118.

Accordingly, the process uniformity during substrate processing may also be more uniform when the NEP plasma density profile 306 is achieved. One approach to controlling the ion diffusion may be based, at least in part, on the power applied to the ring cavity. For example, the diffusion rate and plasma density profile may be optimized depending on the process conditions and/or hardware that generate the first plasma region 108.

In one embodiment, the RF or AC power source 302 may be used to alter the diffusion rate or plasma density profile based, at least in part, on the diffusion between the first plasma region 108 and the second plasma region 120. In one specific embodiment, the power source 302 may apply an alternating voltage between zero volts and 400V with a frequency of up to 60 MHz. In this case, the non-ambipolar diffusion is merely momentary and not constant as in the DC power embodiment. This momentary diffusion may be due to the lack of net current flow in the RF power source 302. The momentary diffusion may due to the electron-ion mobility of the first plasma region 108 and/or the second plasma region 120 when the plasma potential is above zero volts. In one specific embodiment to improve power transmission quality and control, the RF power source 302 may be coupled in parallel with a first capacitor 308 and in series with an inductor 310, and a second capacitor 312.

In another embodiment, one approach to controlling the ion diffusion may be based, at least in part, on the power applied to the ring cavity. For example, the diffusion rate and plasma density profile may be optimized depending on the process conditions and/or hardware that generate the first plasma region 108. Being able to alter the diffusion rate or profile by varying the power during substrate processing or when processing different substrates using the same plasma chamber 102 without substantial mechanical reconfiguration may be desirable.

Figure 4:
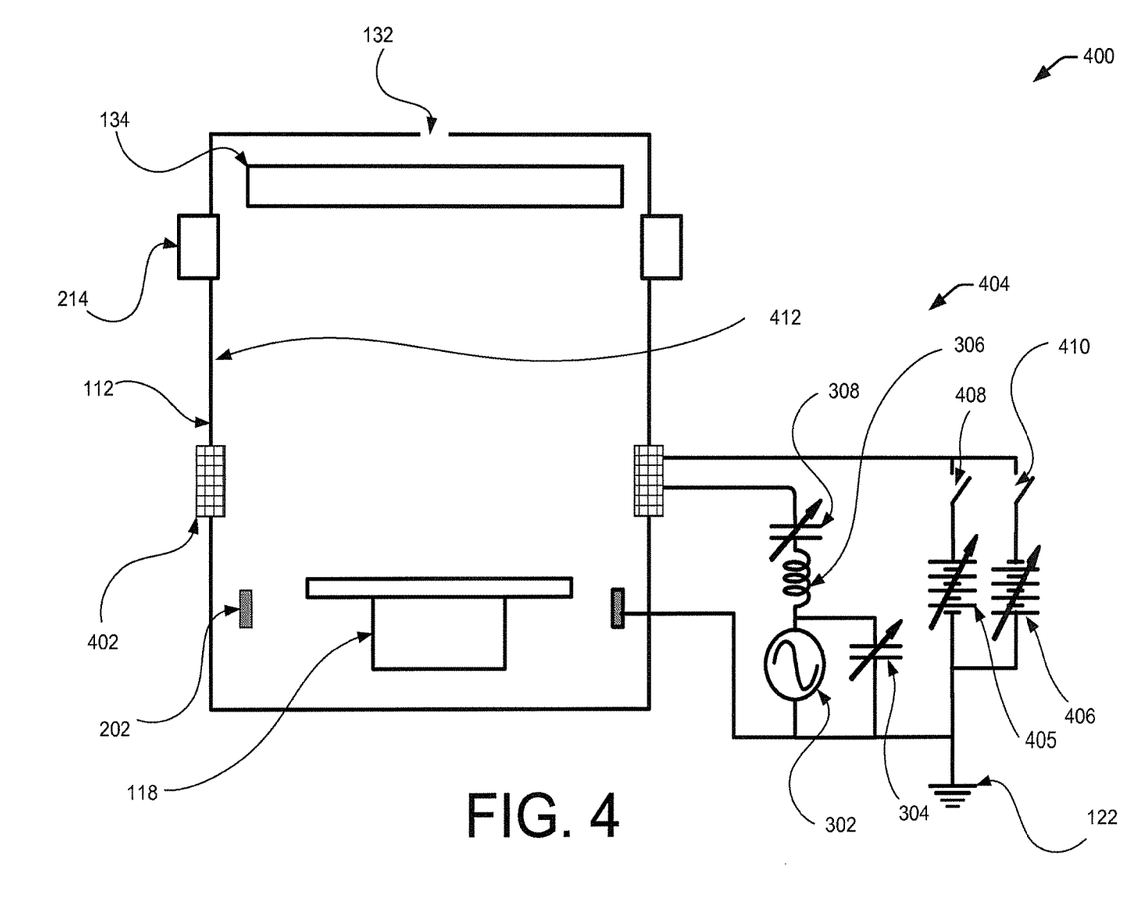
FIG. 4 is an illustration of a representative embodiment of a plasma processing system that shows a schematic cross-sectional illustration of a plasma chamber that includes a ring plasma source coupled to an RF power source, a positive direct current (DC) source, and a negative DC source.

FIG. 4 shows a schematic cross-sectional illustration 400 of a plasma chamber 102 that includes a ring plasma source 402 coupled to an integrated power source 404 that enables the distribution of a variety of power sources to the ring plasma source 402 or the electrode 210. In one embodiment, the integrated power source 404 RF may include, but is not limited to, a RF power source 302, a positive DC source 405, and a negative DC source 406. The positive DC source 405 may be coupled to a first switch 408 that controls when the positive DC power source 405 may be applied to the ring plasma source 402. The first switch 408 may be tied to a controller (not shown) that may open and close the circuit for a specific duration or may open and close the first switch 408 at a certain frequency. Further, the negative DC source 406 may be coupled to a second switch 410 that controls when the negative DC power source 406 may be applied to the ring plasma source 402. The second switch 410 may be tied to a controller (not shown) that may open and close the circuit for a specific duration or may open and close the second switch 410 at a certain frequency. In one embodiment, the plasma processing system 100 may include a controller (not shown) that may enable the transfer of transmitted power between the sources of the integrated power source 404 during substrate processing or during an interval between substrate processing.

In the FIG. 4 embodiment, the ring plasma source 402 may be embedded into the chamber wall 112 or may be substituted with the ring cavity 116 described in previous embodiments. The ring plasma source 402 may be electrically isolated from the chamber wall 112 that may also include a dielectric 412 (e.g., quartz or ceramic) film or material disposed along the chamber wall 112 surface. The ring plasma source 402 may use the integrated power source 404 or any of the other power sources described in this application. Likewise, the integrated power source 404 may also be used with the other plasma chamber 102 embodiments described in this application.

Another approach to controlling ion 110 diffusion may include varying the geometry of the openings 126 between the ring cavity 116 and the plasma chamber 102.

Figure 5:
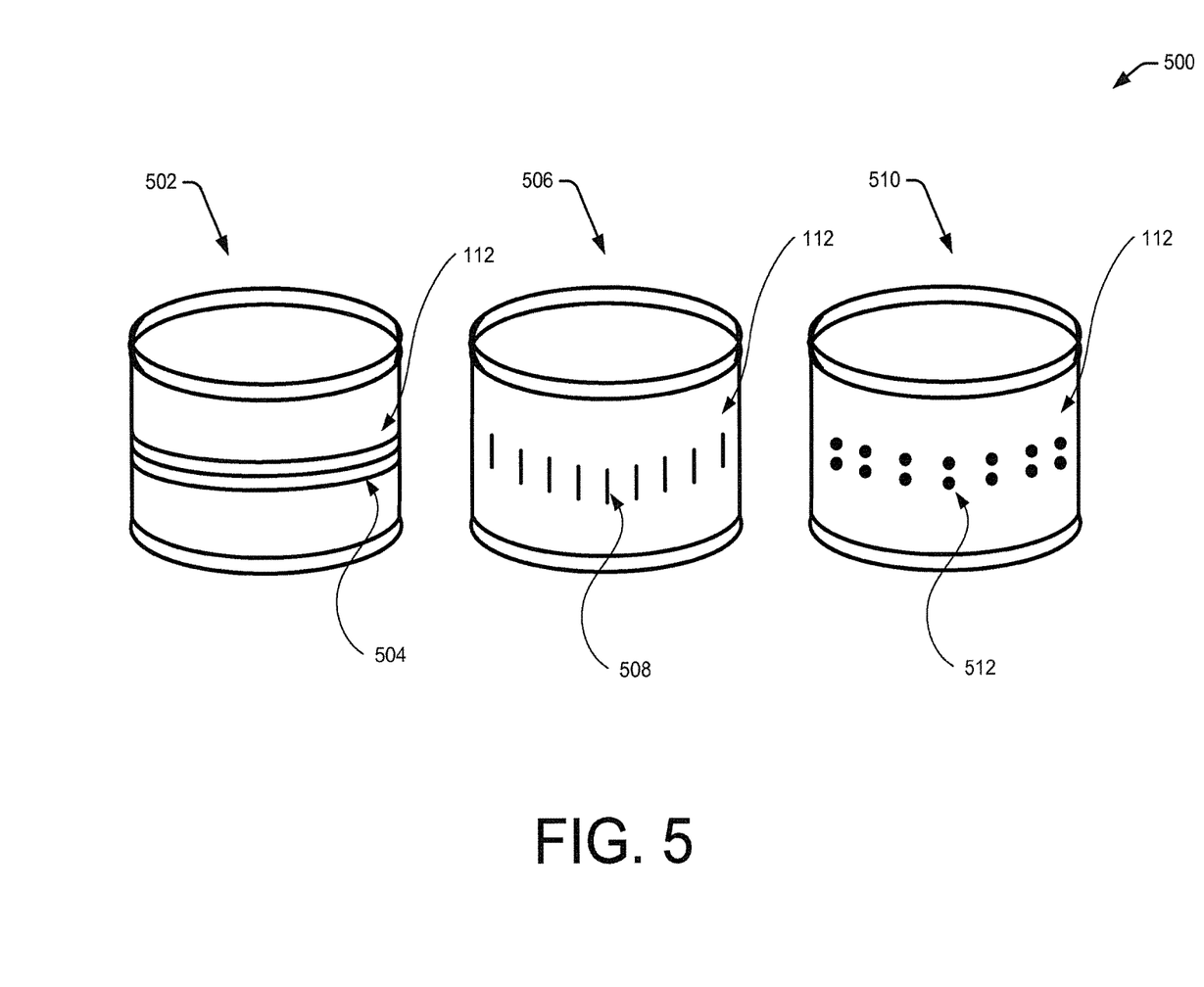
FIG. 5 includes illustrations of ring cavity opening embodiments of the non-ambipolar source.

FIG. 5 includes illustrations 500 of the opening 126 embodiments that enable fluid communication between the ring cavity 116 and the plasma chamber 102 (e.g., first plasma region 108). The openings 126 may enable ion 110 diffusion into the first plasma region 108. The illustrations 500 in FIG. 5 include a perspective view of the plasma chamber 102 without the ring cavity 116. The chamber wall 112 is visible in each of the embodiments along with different types of openings 126 that may be used enable plasma density uniformity control over the substrate holder 118. In general, the black lines, or objects, in FIG. 5 proximate to the center of the chamber wall 112 may be considered openings 126 that may enable non-ambipolar diffusion described in this application.

In the continuous ring embodiment 502, the ring openings 504 may extend around the chamber wall 112 in a continuous manner. Although only three ring openings 504 are shown in FIG. 5, the number and size of the ring openings are not limited to this embodiment within the scope of this disclosure. In fact, in other embodiments, the ring openings 504 may be disposed in a non-continuous manner around the chamber wall 112. For example, the ring openings 504 may form horizontal slits that may be separated from each other by the chamber wall 112.

In the slot opening embodiment 506, horizontal slit openings 508 may be arranged around the chamber wall 112 in a substantially horizontal manner. However, the slit openings may also be angled between zero and 90 degrees from the orientation shown in FIG. 5. Horizontal slit openings 508 may also be different shapes besides rectangular. The shapes may include, but are not limited to, oblong, elliptical, square, triangular, and the like. Further, the density of the horizontal slit openings 508 may also be closer together than as shown in FIG. 5. In other embodiments, the area of the horizontal slit openings 508 may also vary.

For example, in the hole embodiment 510, the openings 126 may include holes 512 that are arranged around the chamber wall 112 in a symmetric or asymmetric manner. As shown in FIG. 5, a pair of holes 512 may proximate to each other and the pattern may repeat around the chamber wall 112. However, the scope of the claim should not be limited to this illustrated embodiment. For example, the pair of holes 512 may be horizontally offset from each other such that the single holes 512 may each be aligned along distinct or unique vertical axis.

In other embodiments, the positioning of the ring cavity 116 relative to the substrate holder 118 may also vary in a variety of ways and still be able to enable non-ambipolar diffusion. For example, the ring cavity 116 may be positioned below or perpendicular to the substrate holder 118.

Figure 6:
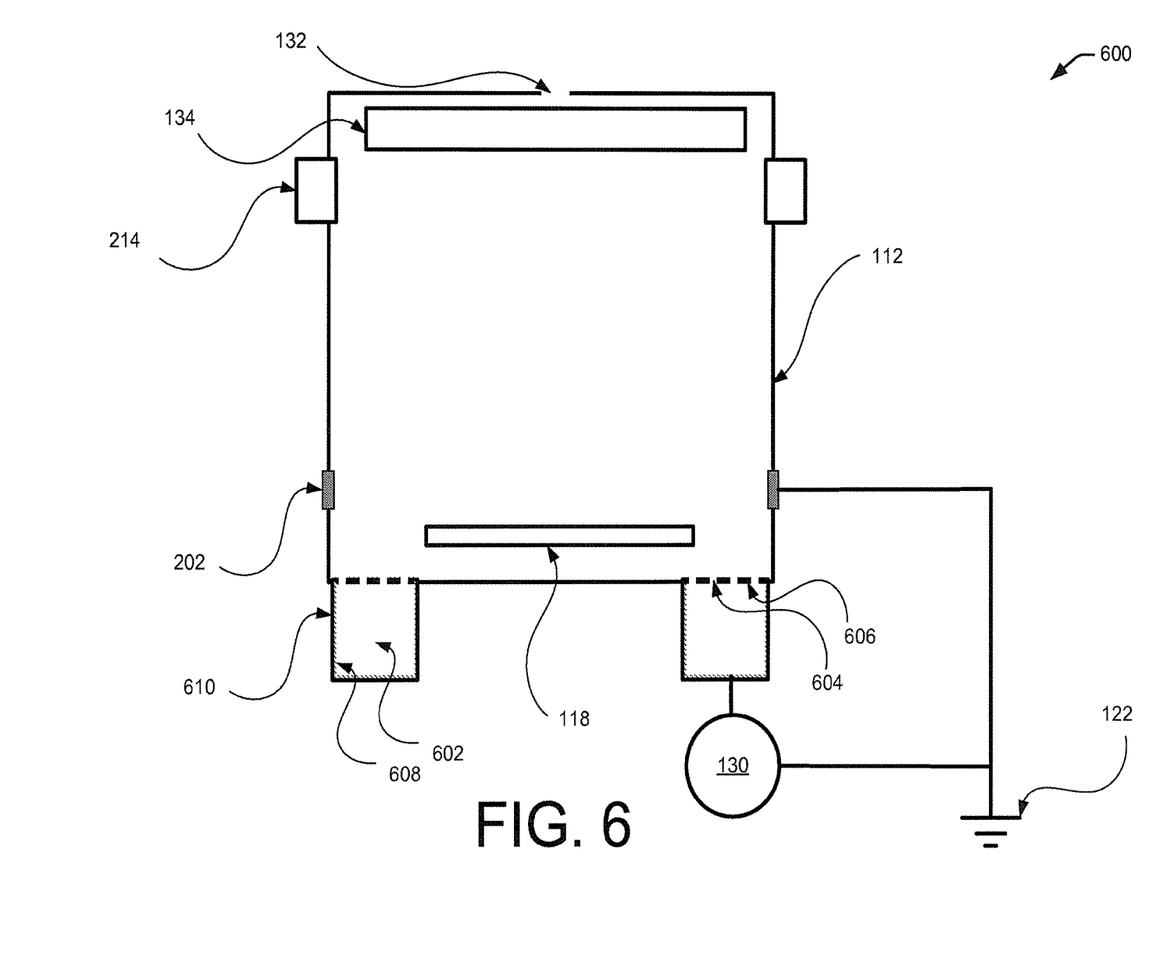
FIG. 6 is an illustration of a representative embodiment of a plasma processing system that shows a schematic cross-sectional illustration of a plasma chamber that includes a non-ambipolar plasma source subjacent to a substrate holder.

FIG. 6 shows a schematic cross-sectional illustration 600 of a plasma chamber 102 that includes a non-ambipolar plasma source subjacent to the substrate holder 118. However, in other embodiments, the orientation of the non-ambipolar source may be placed in any direction or orientation. In FIG. 6, the subjacent ring cavity 602 is disposed below the substrate holder 118 with the subjacent openings 604 and subjacent walls 606 that may a part of a horizontal plane that is perpendicular or substantially perpendicular to the substrate holder 118. The subjacent ring cavity 602 may operate in a similar manner as the ring cavity 116 described in this application. The subjacent ring cavity 602 may include a subjacent electrode 608 that may be coupled to the interior wall 610. The subjacent electrode 608 may be coupled to a boundary power supply 130, coupled to ground 122, that may enable, at least in part, plasma (not shown) within the subjacent ring cavity 602. The plasma may diffuse ions 110 towards the substrate holder 118 or towards plasma that may be generated by the plasma source 134 and/or the secondary plasma source 214. The subjacent ring cavity 602 may also be used in conjunction with a ground ring 202 in a similar manner as described in the description of FIG. 2.

Figure 7:
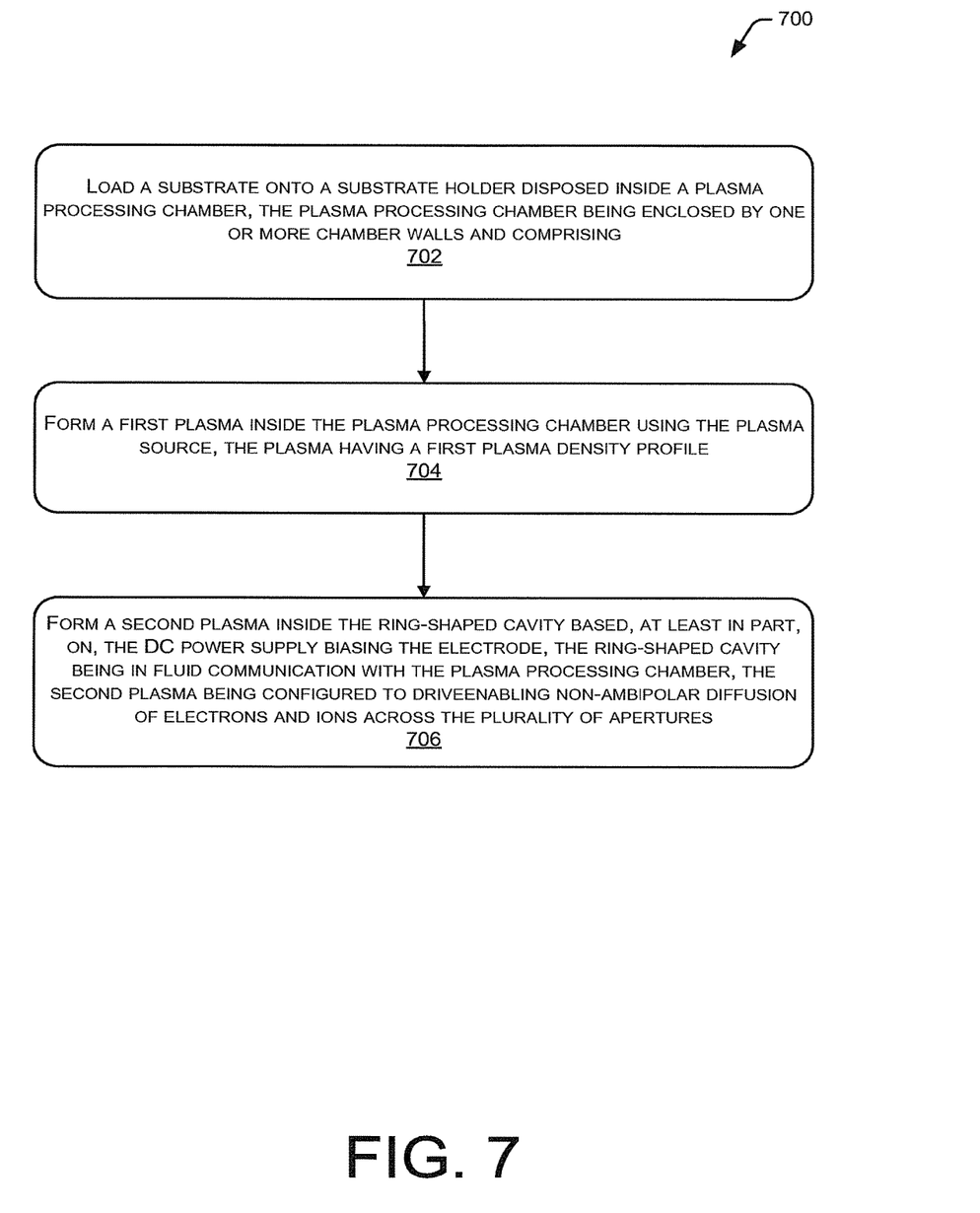
FIG. 7 is a flow diagram for a method for implementing a boundary potential profile in the plasma chamber using the non-ambipolar source.

FIG. 7 is a flow diagram 700 for a method for implementing a boundary potential profile (e.g., plasma potential distribution 310) in the plasma chamber 102 using the non-ambipolar source (e.g., ring cavity 116). The method may be implemented using one or more of the hardware embodiments described in the description of FIGS. 1-6 or any other hardware that may fall within the scope of the claims as drafted.

At block 702, a wafer handling mechanism (not shown) may load a substrate onto a substrate holder 118 that may be disposed inside a plasma processing chamber 102. The plasma processing chamber 102 may be enclosed by one or more chamber walls and may include a plasma source 134 configured to energize plasma (e.g., first plasma region 108) within the chamber walls 112. The plasma processing chamber 102 may also include a ring-shaped cavity 116 in fluid communication with the plasma processing chamber 102 via a plurality of openings 126 disposed on the interior wall 212. The ring-shaped cavity 116 may also include an electrode 210 that can be in fluid communication with plasma and may receive power from a power supply 130 that may bias the electrode 210.

At block 704, the plasma source 134 may receive power from the plasma power source 106 and gas from the gas delivery system 104. Based at least in part on this combination, a first plasma region 108 may be formed inside the plasma processing chamber 102. The first plasma region 108 may form a first plasma density profile 304 indicates that the plasma density is higher at the center of the substrate holder 118 than at the edge.

At block 706, the ring cavity 116 may use power provided by the boundary power supply 130 and gas from the gas delivery system 104 to form a second plasma region 120 proximate to the ring-shaped cavity 115. In this embodiment, the ring-shaped cavity 116 may be in fluid communication with the plasma processing chamber through the openings 126. The interaction between the first plasma region 108 and the second plasma region 120 may enable non-ambipolar diffusion of electrons 124 and ions 110 across the plurality of openings 126.

The non-ambipolar diffusion may enable the formation of the plasma potential distribution 310 or wall double layer (W-DL) across the plasma chamber 102 as described in the description of FIG. 3. As a result of the W-DL, the first plasma density profile 304 may be altered to form the NEP plasma density profile 306 that is more uniform that the first density profile 304. As shown in FIG. 3, the NEP plasma density profile 306 is different from the first density profile 304, in that the plasma density across the substrate holder 118 may be more uniform or flatter from the center to the edge of the substrate holder 118.

In one embodiment, the non-ambipolar diffusion may include, but is not limited to, the diffusion of the electrons 124 from the first plasma region 108 to the second plasma region 120 and the diffusion of the ions 110 from the second plasma region 120 to the first plasma region 108. The diffusion of the electrons 124 and the ions 110 being based, at least in part, on a potential difference between the first plasma region 108 and the second plasma region 120. In one embodiment, the non-ambipolar diffusion direction may be parallel or substantially parallel to the substrate holder 118.

It is to be appreciated that the Detailed Description section, and not the Abstract section, is intended to be used to interpret the claims. The Abstract section can set forth one or more, but not all exemplary embodiments, of the present disclosure, and thus, is not intended to limit the present disclosure and the appended claims in any way.

While the present disclosure has been illustrated by the description of one or more embodiments thereof, and while the embodiments have been described in considerable detail, they are not intended to restrict or in any way limit the scope of the appended claims to such detail. Additional advantages and modifications will readily appear to those skilled in art. The invention in its broader aspects is therefore not limited to the specific details, representative apparatus and method and illustrative examples shown and described. Accordingly, departures may be made from such details without departing from the scope of the general inventive concept.

What is claimed is:

1. A method for treating a substrate, comprising:
providing a processing apparatus including a plasma processing chamber, the processing apparatus comprising:
 a substrate holder, disposed in the processing chamber, that receives a substrate to be treated;
 a gas supply system for supplying a gas mixture to the processing chamber;
 a plasma source in the plasma processing chamber configured to energize the gas mixture into a first plasma in a first plasma region in the plasma processing chamber, wherein the substrate holder is located in the first plasma region;
 a ring-shaped cavity disposed in the side wall of the plasma processing chamber, above the substrate holder, the ring-shaped cavity being in fluid communication with the plasma processing chamber via a plurality of openings disposed in the sidewall, the ring-shaped cavity comprising an electrode, wherein the ring-shaped cavity is configured to form a second plasma in a second plasma region within the ring-shaped cavity; and
 a DC power supply;
forming the first plasma in the first plasma region, with a substrate positioned on the substrate holder in the first plasma region in the plasma processing chamber;
forming the second plasma in the second plasma region; and
applying a positive DC bias to the electrode with the DC power supply to provide a potential difference between the first plasma region and the second plasma region and driving a non-ambipolar diffusion across the plurality of openings such that electrons diffuse from the plasma processing chamber to the cavity to decrease an amount of electrons in the plasma processing chamber and ions diffuse from the cavity to the plasma processing chamber to increase an amount of ions in the plasma processing chamber.

2. The method of claim 1, wherein the plurality of openings comprises a plurality of slits.

3. The method of claim 2, wherein the plurality of openings are substantially vertical.

4. The method of claim 2, wherein the plurality of openings are substantially horizontal.

5. The method of claim 1, wherein the plurality of openings comprises an array of holes.

6. The method of claim 1, wherein a wall of the cavity having the plurality of openings therein is made of a dielectric material.

7. The method of claim 6, wherein the dielectric material is quartz.

8. The method of claim 1, wherein the plasma source is a surface wave plasma (SWP) source.

9. The method according to claim 1, wherein the potential difference is at least 100 volts.

10. The method of claim 1, further including providing a first switch that selectively provides the positive DC bias to the electrode of the ring-shaped cavity;
providing a negative DC bias and a second switch that selectively provides the negative DC bias to the electrode of the ring-shaped cavity; and
providing an RF power supply coupled to the electrode of the ring-shaped cavity.

11. A method for treating a substrate, comprising:
providing a processing apparatus including a plasma chamber comprising a sidewall, the processing apparatus further comprising:
 a gas distribution system that provides gases to the plasma chamber;
 a power supply configured to apply power to a plasma source in the plasma chamber to form a first plasma in a first plasma region in the plasma chamber using the gases;
 a substrate holder positioned in the plasma chamber in the first plasma region, such that a substrate supported by the substrate holder is processed by the first plasma;

a diffusion component in fluid communication with the plasma chamber, the diffusion component comprising an electrode, and a power source that biases the electrode to generate a second plasma in a second plasma region within the diffusion component;

forming the first plasma in the first plasma region, with a substrate supported by the substrate holder in the first plasma region;

forming the second plasma in the second plasma region; and providing a potential difference between the first plasma region and the second plasma region and providing non-ambipolar diffusion such that electrons are diffused from the first plasma region to the second plasma region to decrease an amount of electrons in the first plasma region and ions are diffused from the second plasma region to the first plasma region to increase an amount of ions in the first plasma regions.

12. The method of claim 11, wherein the potential difference is at least 100 volts.

13. The method of claim 11, wherein the diffusion component comprises a ring-shaped cavity in communication with the plasma processing chamber, and wherein the ring-shaped cavity extends around the substrate holder.

14. The method of claim 11, wherein the diffusion component includes a ring-shaped cavity disposed in an annular pumping duct of the plasma processing chamber.

15. The method of claim 11, further comprising providing a ground electrode surrounding the substrate holder and disposed proximate to the diffusion component.

16. The method of claim 11, wherein the diffusion component comprises a wall formed of a dielectric material, and wherein a plurality of openings extend through said wall, and wherein the first plasma region and the second plasma region are in communication with each other by way of said plurality of openings.

17. The method of claim 11, wherein the power source of the diffusion component comprises:
a positive DC bias and a first switch that selectively provides the positive DC bias to the electrode;
a negative DC bias and a second switch that selectively provides the negative DC bias to the electrode; and
an RF power supply coupled to the electrode.

18. A method for treating a substrate, comprising:
providing a processing apparatus including a plasma chamber comprising a sidewall, the plasma chamber processing apparatus further comprising:
a gas distribution system that provides gases to the plasma chamber;
a power supply configured to apply power to gases in the plasma chamber to form a first plasma in a first plasma region within the plasma chamber;
a substrate holder positioned in the plasma chamber in the first plasma region, such that a substrate supported by the substrate holder is processed by the first plasma;
a diffusion component in fluid communication with the plasma chamber, the diffusion component comprising a cavity, an electrode disposed in the cavity, and a power source that applies power to the electrode in the cavity to generate a second plasma in a second region within the diffusion component;
wherein the diffusion component comprises a wall formed of a dielectric material, and wherein a plurality of openings extend through said wall, and
wherein the first plasma region and the second plasma region are in communication with each other by way of said plurality of openings;
forming the first plasma in the first plasma region, with a substrate supported by the substrate holder in the first plasma region;
forming the second plasma in the second plasma region; and
providing a potential difference between the first plasma region and the second plasma region to provide a non-ambipolar diffusion such that electrons are diffused from the first plasma region to the second plasma region to decrease an amount of electrons in the first plasma region and ions are diffused from the second plasma region to the first plasma region to increase an amount of ions in the first plasma region.

19. A method according to claim 18, wherein the power source comprises a positive DC power source.

20. A method according to claim 19, wherein the power source further comprises a radio frequency power source.

* * * * *